US010320425B2

(12) United States Patent
Farhoodfar et al.

(10) Patent No.: US 10,320,425 B2
(45) Date of Patent: *Jun. 11, 2019

(54) STAIRCASE FORWARD ERROR CORRECTION CODING

(71) Applicant: INPHI CORPORATION, Santa Clara, CA (US)

(72) Inventors: Arash Farhoodfar, Milpitas, CA (US); Frank R. Kschischang, Mississauga (CA); Andrew Hunt, Ottawa (CA); Benjamin P. Smith, Ottawa (CA); John Lodge, Dunrobin (CA)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/194,432

(22) Filed: Jun. 27, 2016

(65) Prior Publication Data

US 2016/0308558 A1 Oct. 20, 2016

Related U.S. Application Data

(63) Continuation of application No. 14/266,299, filed on Apr. 30, 2014, now Pat. No. 9,397,702, which is a (Continued)

(51) Int. Cl.
*H04J 3/16* (2006.01)
*H04L 1/00* (2006.01)
(Continued)

(52) U.S. Cl.
CPC ....... *H03M 13/2906* (2013.01); *H03M 13/15* (2013.01); *H03M 13/2707* (2013.01);
(Continued)

(58) Field of Classification Search
CPC .......... H03M 13/2906; H03M 13/616; H03M 13/2927; H03M 13/2707; H03M 13/15;
(Continued)

(56) References Cited

U.S. PATENT DOCUMENTS 5,719,884 A 2/1998 Roth et al.
6,810,499 B2 10/2004 Sridharan et al.
(Continued)

FOREIGN PATENT DOCUMENTS

| EP | 1111799 B1 | 6/2001 |
|---|---|---|
| WO | 0176080 A2 | 10/2001 |
| WO | 2010057011 A3 | 5/2010 |

OTHER PUBLICATIONS

Author: Wikipedia, Title: Application-Specific Integrated Circuit, Original Date: Nov. 16, 2002 (Year: 2002).*
(Continued)

*Primary Examiner* — Thien Nguyen

(57) ABSTRACT

In staircase forward error correction coding, a stream of data symbols are mapped to data symbol positions in a sequence of two-dimensional symbol blocks $B_i$, a positive integer. Each of the symbol blocks has data symbol positions and coding symbol positions. Coding symbols for the coding symbol positions in each symbol block $B_i$ in the sequence are computed. The coding symbols are computed such that, for each symbol block $B_i$ that has a preceding symbol block $B_{i-1}$ and a subsequent symbol block $B_{i+1}$ in the sequence, symbols at symbol positions along one dimension of the preceding symbol block $B_{i-1}$, concatenated with the data symbols and the coding symbols along the other dimension in the symbol $B_i$, form a codeword of a FEC component code, and symbols at symbol positions along the one dimension of the symbol $B_i$, concatenated with the data symbols
(Continued)

and the coding symbols along the other dimension in the subsequent symbol block $B_{i+1}$, form a codeword of the FEC component code. Thus, each row in $[B_{i-1}^T \; B_i]$ and each column in $$\begin{bmatrix} B_i \\ B_{i+1}^T \end{bmatrix},$$

for example, is a valid codeword.

8 Claims, 4 Drawing Sheets

Related U.S. Application Data continuation of application No. 13/085,810, filed on Apr. 13, 2011, now Pat. No. 8,751,910.

(51) Int. Cl.
| | |
|---|---|
| *H03M 13/00* | (2006.01) |
| *H03M 13/15* | (2006.01) |
| *H03M 13/27* | (2006.01) |
| *H03M 13/29* | (2006.01) |
| *H03M 13/37* | (2006.01) |
| *H04J 14/08* | (2006.01) |

(52) U.S. Cl.
CPC ... *H03M 13/2721* (2013.01); *H03M 13/2918* (2013.01); *H03M 13/2927* (2013.01); *H03M 13/3746* (2013.01); *H03M 13/616* (2013.01); *H04J 3/1658* (2013.01); *H04J 14/08* (2013.01); *H04L 1/0042* (2013.01); *H04L 1/0057* (2013.01)

(58) Field of Classification Search
CPC ......... H03M 13/3746; H03M 13/2721; H03M 13/2918; H04J 3/1658; H04J 14/08; H04L 1/0057; H04L 1/0042
See application file for complete search history.

(56) References Cited

U.S. PATENT DOCUMENTS

| | | |
|---|---|---|
| 7,509,563 B2 | 3/2009 | Ilani |
| 8,065,585 B1 | 11/2011 | Abbaszadeh et al. |
| 8,276,047 B2 | 9/2012 | Coe |
| 8,335,962 B2 | 12/2012 | Eberlein et al. |
| 2005/0251723 A1 | 11/2005 | Ilani |
| 2007/0143659 A1 | 6/2007 | Ball |
| 2007/0269218 A1 | 11/2007 | Zhang |
| 2007/0288833 A1 | 12/2007 | Djurdjevic et al. |
| 2008/0104479 A1* | 5/2008 | Lablans ............... H04L 1/0065 714/757 |
| 2009/0208218 A1 | 8/2009 | Xiao et al. |
| 2010/0299578 A1* | 11/2010 | Shin ................... H03M 13/251 714/776 |
| 2011/0116515 A1 | 5/2011 | Van Houtum et al. |
| 2012/0183303 A1 | 7/2012 | Onohara et al. |

OTHER PUBLICATIONS

E. Martinian, C-E W. Sundberg; "Low Delay Burst Erasure Correction Codes", 2002, ICC 2002, IEEE International Conference on Communications, (vol. 3), pp. 1736-1740.
Y.Q. Shi, X.M. Zhang, Z-C Ni & N. Ansari; "Interleaving for Combating Bursts of Errors," IEEE Circuits and Systems Magazine, First Quarter 2004, pp. 29-42.
E. Martinian, C-E W. Sundberg; "Burst Erasure Correction Codes With Low Decoding Delay", IEEE Transactions on Information Theory, vol. 50, Issue 10, Oct. 2004, pp. 2494-2502.
H. Liu, H. Ma, M. El Zarki & S. Gupta; "Error control schemes for networks: An overview", Mobile Networks and Applications 2 (1997) pp. 167-182.
S.J. Johnson & T. Pollock; "LDPC Codes for the Classic Bursty Channel", International Synposium on Information Theory and its Applications, ISITA 2004, Parma, Italy, Oct. 10-13, 2004, 6 pages.
A.J. McAuley; "Reliable Broadband Communication Using a Burst Erasure Correcting Code", Presented at ACM SIGCOMM '90, Philadelphia, Pa. Sep. 1990, pp. 1-10.
"Upstream FEC Errors and SNR as Ways to Ensure Data Quality and Throughput", Document ID: 49780, Cisco Systems, Inc. Updated Oct. 4, 2005, 16 pages.
ITU-T Telecommunication Standardization Sector of ITU, G.975.1 (Feb. 2004), "Series G: Transmission Systems and Media, Digital Systems and Networks", 58 pages.
W. Zhang, M. Lentmaier, K. SH. Zigangirov & D.J. Costello "Braided Convolutional Codes: A New Class of Turbo-Like Codes", IEEE Transactions on Information Theory, (vol. 56, Issue 1), Jan. 2010, pp. 316-331.
D. Truhachev, M. Lentmaier, K. Zigangirov; "On Braided Block Codes", ISIT 2003, Yokohama, Japan, Jul. 4, 2003, 1 page.
K. Zigangirov, A.J. Felstrom, M. Lentmaier, D. Truhachev, "Encoders and Decoders for Braided Block Codes", ISIT 2006, Seattle, USA, Jul. 9-14, 2006, pp. 1808-1812.
C.P.M.J. Baggen & L.M.G.M. Tolhuizen; "On Diamond Codes", IEEE Transactions on Information Theory, vol. 43, No. 5, Sep. 1997, pp. 1400-1411.
M.C.O. Bogino, P. Cataldi, M. Grangetto, E. Magli, G. Olmo; "Sliding-Window Digital Fountain Codes for Streaming of Multimedia Contents", ISCAS 2007, IEEE International Symposium on Circuits and Systems, May 27-30, 2007, pp. 3467-3470.
D. Sejdinovic, D. Vukobratovic, A. Doufexi, V. Senk & R.J. Piechocki; "Expanding Window Fountain Codes for Unequal Error Protection", IEEE Transactions on Communications, vol. 57, No. 9, Sep. 2009, pp. 2510-2516.
"Architecture of optical transport networks", Amendment 1; International Telecommunication Union; ITU-T; G.872 (Dec. 2003), Series G: Transmission Systems and Media, Digital Systems and Networks; Digital networks—Optical Transport Networks.
"Architecture of optical transport networks", Amendment 2; International Telecommunication Union; ITU-T; G.872 (Jul. 2010), Series G: Transmission Systems and Media, Digital Systems and Networks; Digital networks—Optical Transport Networks.
"Interfaces for the Optical Transport Network (OTN)". International Telecommunication Union; ITU-T; G.709/Y.1331 (Dec. 2009). Series G: Transmission Systems and Media, Digital Systems and Networks; Digital terminal equipments—General; Series Y: Global Information Infrastructure, Internet Protocol Aspects and Next-Generation Networks; Internet protocol Aspects—Transport.
"Interfaces for the Optical Transport Network (OTN)". Amendment 1. International Telecommunication Union; ITU-T; G.709/Y.1331 (Jul. 2010). Series G: Transmission Systems and Media, Digital Systems and Networks; Digital terminal equipments—General; Series Y: Global Information Infrastructure, Internet Protocol Aspects and Next-Generation Networks; Internet protocol Aspects—Transport.
"Interfaces for the Optical Transport Network (OTN)". Corrigendum 1; International Telecommunication Union; ITU-T; G.709/Y.1331 (Jul. 2010). Series G: Transmission Systems and Media, Digital Systems and Networks; Digital terminal equipments—General; Series Y: Global Information Infrastructure, Internet Protocol Aspects and Next-Generation Networks; Internet protocol Aspects—Transport.
Architecture of optical transport networks. Corrigendum 1; International Telecommunication Union; ITU-T; G.872 (Jan. 2005). Series G: Transmission Systems and Media, Digital Systems and Networks; Digital networks Optical Transport Networks.
"Erratum 1 (May 2010) to Recommendation ITU-T, G.608/Y.1331 (Dec. 2009), Interfaces for the Optical Transport Network (OTN)".

(56) References Cited

OTHER PUBLICATIONS

Covering Note; General Secretariat of the International Telecommunication Union. Geneva, May 4, 2010.
"Architecture of optical transport networks". International Telecommunication Union; ITU-T Recommendation; G.872 (Nov. 2001). Series G: Transmission Systems and Media, Digital Systems and Networks; Digital networks—Optical Transport Networks.
"Forward error correction for high bit-rate DWDM submarine systems". Corrigendum 1; International Telecommunication Union; ITU-T; G.975 (Feb. 2006). Series G: Transmission Systems and Media, Digital Systems and Networks; Digital sections and digital line system—Optical fibre submarine cable systems.
"Forward error correction for high bit-rate DWDM submarine systems". Telecommunication Standardization Sector; ITU-T; G.875. 1; (Feb. 2004); Series G: Transmission Systems and Media Digital Systems and Networks.
Alberto Jimenez Feltstrom et al, "Braided Block Codes", IEEE Transactions on Information Theory, vol. 55, No. 6, Jun. 2009, 19 pages.
Tom Richardson, et al, Modem Coding Theory, Cambridge University Press, Cambridge, New York, 18 pages Published on 2008.
A.D. Wyner, "Analysis of Recurrent Codes", IEEE Transactions on Information Theory, 14 pages. Published Jul. 1963.
Frank R. Kschischang, "Factor Graphs and the Sum Product Algorithm", IEEE Transactions of Information Theory, vol. 47, No. 2, Feb. 2011, 22 pages.
U.S. Final Office Action dated Aug. 1, 2013 in respect of U.S. Appl. No. 13/085,810 (20 pages).
U.S. Office Action dated Mar. 13, 2013 in respect of U.S. Appl. No. 13/085,810 (19 pages).
Notice of Allowance and Notice of Allowability dated Jan. 31, 2014 in respect of U.S. Appl. No. 13/085,810 (10 pages).
Notice of Allowance and Notice of Allowability dated Mar. 17, 2016 in respect of U.S. Appl. No. 14/266,299 (15 pages).

* cited by examiner

STAIRCASE FORWARD ERROR CORRECTION CODING

CROSS-REFERENCE TO RELATED APPLICATIONS

This application is a continuation of U.S. patent application Ser. No. 14/266,299 filed on Apr. 30, 2014, which is a continuation of U.S. patent application Ser. No. 13/085,810 filed on Apr. 13, 2011, the contents both of which are incorporated in their entirety herein by reference.

FIELD OF THE INVENTION

This invention relates generally to encoding and decoding and, in particular, to staircase Forward Error Correction (FEC) coding.

BACKGROUND

FEC coding provides for correction of errors in communication signals. Higher coding gains provide for correction of more errors, and can thereby provide for more reliable communications and/or allow signals to be transmitted at lower power levels.

The Optical Transport Hierarchy (OTH), for example, is a transport technology for the Optical Transport Network (OTN) developed by the International Telecommunication Union (ITU). The main implementation of OTH is described in two recommendations by the Telecommunication Standardization section of the ITU (ITU-T), including:

Recommendation G.709/Y.1331, entitled "Interfaces for the Optical Transport Network (OTN)", December 2009, with an Erratum 1 (May 2010), an Amendment 1 (July 2010), and a Corrigendum 1 (July 2010); and Recommendation G.872, entitled "Architecture of optical transport networks", November 2001, with an Amendment 1 (December 2003), a Correction 1 (January 2005), and an Amendment 2 (July 2010).

G.709 defines a number of layers in an OTN signal hierarchy. Client signals are encapsulated into Optical channel Payload Unit (OPUk) signals at one of k levels of the OTN signal hierarchy. An Optical channel Data Unit (ODUk) carries the OPUk and supports additional functions such as monitoring and protection switching. An Optical channel Transport Unit (OTUk) adds FEC coding. Optical Channel (OCh) signals in G.709 are in the optical domain, and result from converting OTUk signals from electrical form to optical form.

FEC coding as set out in G.709 provides for 6.2 dB coding gain. ITU-T Recommendation G.975.1, entitled "Forward error correction for high bit-rate DWDM submarine systems", February 2004, proposes an enhanced FEC coding scheme with improved coding gain.

Further improvements in coding gain, without impractical additional processing resources, remain a challenge.

BRIEF DESCRIPTION OF THE DRAWINGS

Examples of embodiments of the invention will now be described in greater detail with reference to the accompanying drawings.

DETAILED DESCRIPTION

A staircase code is a blockwise recursively encoded forward error correction scheme. It can be considered a generalization of the product code construction to a family of variable latency codes, wherein the granularity of the latency is directly related to the size of the "steps", which are themselves connected in a product-like fashion to create the staircase construction.

In staircase encoding as disclosed herein, symbol blocks include data symbols and coding symbols. Data symbols in a stream of data symbols are mapped to a series of two-dimensional symbol blocks. The coding symbols could be computed across multiple symbol blocks in such a manner that concatenating a row of the matrix transpose of a preceding encoded symbol block with a corresponding row of a symbol block that is currently being encoded forms a valid codeword of a FEC component code. For example, when encoding a second symbol block in the series of symbol blocks, the coding symbols in the first row of the second symbol block are chosen so that the first row of the matrix transpose of the first symbol block, the data symbols of the first row of the second symbol block, and the coding symbols of the same row of the second block together form a valid codeword of the FEC component code.

Coding symbols could equivalently be computed by concatenating a column of the previous encoded symbol block with a corresponding column of the matrix transpose of the symbol block that is currently being encoded.

With this type of relationship between symbol blocks, in a staircase structure that includes alternating encoded symbol blocks and matrix transposes of encoded symbol blocks, each two-block wide row along a stair "tread" and each two-block high column along a stair "riser" forms a valid codeword of the FEC component code.

In some embodiments, a large frame of data can be processed in a staircase structure, and channel gain approaching the Shannon limit for a channel can be achieved. Low-latency, high-gain coding is possible. For 1.25 Mb to 2 Mb latency, for example, some embodiments might achieve a coding gain of 9.4 dB for a coding rate of 239/255, while maintaining a burst error correction capability and error floor which are consistent with other coding techniques that exhibit lower coding gains and/or higher latency.

Figure 1:
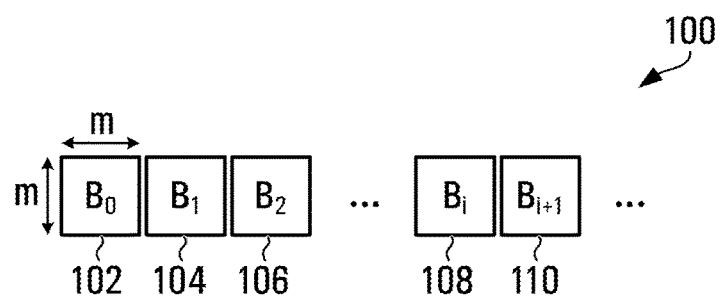
FIG. 1 is a block diagram illustrating a sequence of two-dimensional symbol blocks.

FIG. 1 is a block diagram illustrating a sequence of two-dimensional symbol blocks. In the sequence 100, each $B_i$(for i≥0) 102, 104, 106, 108, 110 is an m by m array of symbols. Each symbol in each block 102, 104, 106, 108, 110 may be one or more bits in length. Staircase codes are characterized by the relationship between the symbols in successive blocks 102, 104, 106, 108, 110.

Figure 2:
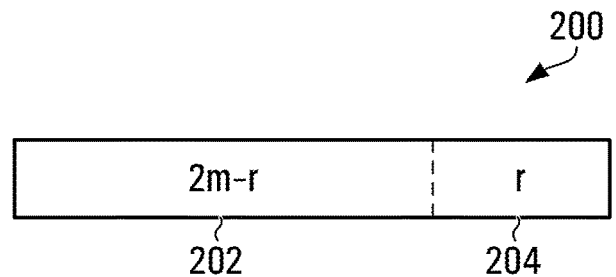
FIG. 2 is a block diagram illustrating an example codeword.

During FEC encoding according to a staircase code, a FEC code in systematic form is first selected to serve as the component code. This code, hereinafter C, is selected to have a codeword length of 2m symbols, r of which are parity symbols. As illustrated in FIG. 2, which is a block diagram illustrating an example length 2m codeword 200, the leftmost 2m-r symbols 202 constitute information or data symbol positions of C, and the rightmost r symbols 204 are parity symbol positions, or more generally coding symbol positions, of C.

Figure 3:
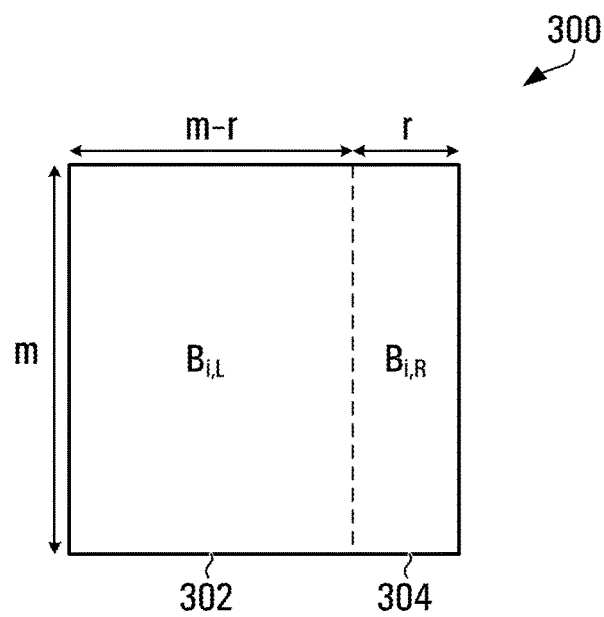
FIG. 3 is a block diagram illustrating an example subdivision of a symbol block.

In light of this notation, for illustrative purposes consider the example sub-division of a symbol block as shown in FIG. 3. The example symbol block 300 is sub-divided into m-r leftmost columns 302 and r rightmost columns 304, where $B_{i,L}$ is the sub-matrix including the leftmost columns, and similarly $B_{i,R}$ is the sub-matrix including the rightmost columns of the symbol block $B_i$.

The entries of the symbol block $B_0$ are set to predetermined symbol values. For $i \geq 1$, data symbols, specifically m(m−r) such symbols, which could include information that is received from a streaming source for instance, are arranged or distributed into $B_{i,L}$ by mapping the symbols into $B_{i,L}$. Then, the entries of $B_{i,R}$ are computed. Thus, data symbols from a symbol stream are mapped to data symbol positions $B_{i,L}$ in a sequence of two-dimensional symbol blocks B and coding symbols for the coding symbol positions $B_{i,R}$ in each symbol block are computed.

In computing the coding symbols according to one example embodiment, an m by (2m−r) matrix, $A=[B_{i-1}^T \ B_{i,L}]$, where $B_{i-1}^T$ is the matrix-transpose of $B_{i-1}$, is formed. The entries of $B_{i,R}$ are then computed such that each of the rows of the matrix $[B_{i-1}^T B_{i,R}]$ is a valid codeword of C. That is, the elements in the jth row of $B_{i,R}$ are exactly the r coding symbols that result from encoding the 2m−r symbols in the jth row of A.

Generally, the relationship between successive blocks in a staircase code satisfies the following relation: For any $i \geq 1$, each of the rows of the matrix $[B_{i-1}^T B_i]$ is a valid codeword of C.

Figure 4:
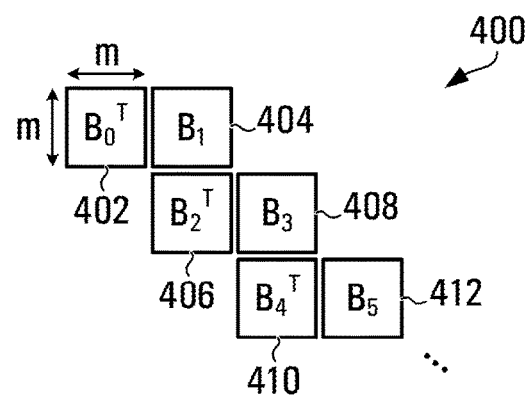
FIG. 4 is a block diagram representation of an example staircase code.

An equivalent description of staircase codes, from which their name originates, is suggested in FIG. 4, which is a block diagram representation of an example staircase code. Every row and every column that spans two symbol blocks 402, 404, 406, 408, 410, 412 in the "staircase" 400 is a valid codeword of C. It should be apparent that each two-block row in FIG. 4 is a row of the matrix $[B_{i-1}^T \ B_{i,L} \ B_{i,R}]$, as described above for the computation of coding symbols. The columns are also consistent with this type of computation.

Consider the first two-block column that spans the first column of $B_1$ 404 and the first column of $B_2^T$ 406. In the example computation described above, the coding symbols for the first row of $B_2$ would be computed such that $[B_1^T B_{2,L} B_{2,R}]$ is a valid codeword of C. Since the first column of $B_1$ 404 would be the first row in $B_1^T$, and similarly the first column of $B_2^T$ 406 would be the first row of $B_2$, the staircase structure 400 is consistent with the foregoing example coding symbol computation.

Therefore, it can be seen that coding symbols for a block $B_i$ could be computed row-by-row using corresponding rows of $B_{i-1}^T$ and $B_i$, as described above. A column-by-column computation using corresponding columns of $B_{i-1}$ and $B_i^T$ would be equivalent. Stated another way, coding symbols could be computed for the coding symbol positions in each symbol $B_i$, where i is a positive integer, in a sequence such that symbols at symbol positions along one dimension (row or column) of the two-dimensional symbol block $B_{i-1}$ in the sequence, concatenated with the information symbols and the coding symbols along the other dimension (column or row) in the symbol $B_i$, form a codeword of a FEC component code. In a staircase code, symbols at symbol positions along the one dimension (row or column) of the symbol block $B_i$ in the sequence, concatenated with the information symbols and the coding symbols along the other dimension (column or row) in the symbol block $B_{i+1}$, also form a codeword of the FEC component code.

The two dimensions of the symbol blocks in this example are rows and columns. Thus, in one embodiment, the concatenation of symbols at symbol positions along a corresponding column and row of the symbol blocks $B_{i-1}$ and $B_i$, respectively, forms a codeword of the FEC component code, and the concatenation of symbols at symbol positions along a corresponding column and row of the symbol blocks $B_i$ and $B_{i+1}$, respectively, also forms a codeword of the FEC component code. The "roles" of columns and rows could instead be interchanged. The coding symbols could be computed such that the concatenation of symbols at symbol positions along a corresponding row and column of the symbol blocks $B_{i-1}$ and $B_i$, respectively, forms a codeword of the FEC component code, and the concatenation of symbols at symbol positions along a corresponding row and column of the symbol blocks $B_i$ and $B_{i+1}$, respectively also forms a codeword of the FEC component code.

Figure 5:
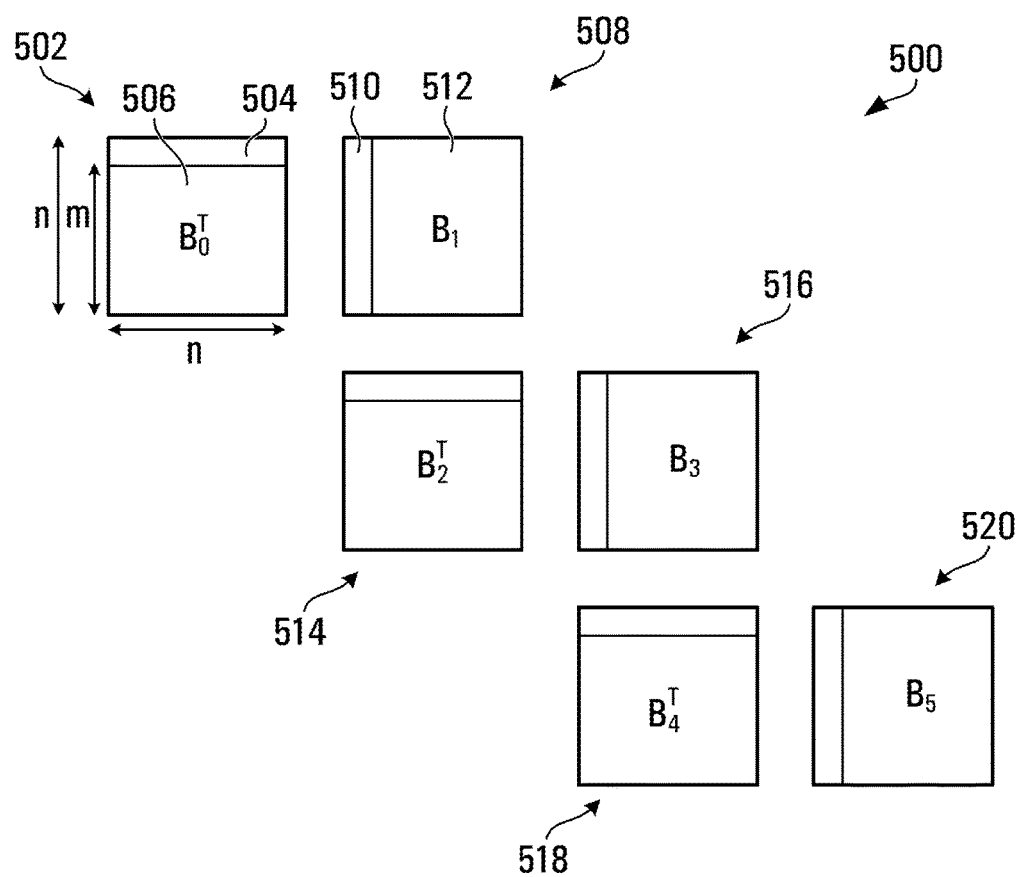
FIG. 5 is a block diagram representation of an example generalized staircase code.

In the examples above, a staircase code is used to encode a sequence of m by m symbol blocks. The definition of staircase codes can be extended to allow each block $B_i$ to be an n by m array of symbols, for $n \geq m$. As shown in FIG. 5, which is a block diagram representation of an example generalized staircase code, (n−m) rows of n predetermined symbols, illustratively zeros, are appended to each block $B_i$. This is shown in the staircase 500 at 504 for block $B_0^T$ 506 and at 510 for block $B_1$ 512. The resultant matrices 502, 508, referenced below as $D_i$, are used in computing coding symbols. In this example, each of the rows of the matrix $[D_{i-1}^T \ B_i]$ is a valid codeword of C. The first (n−m) row codewords are shortened codewords as a result of supplementing the block $B_0^T$ with the (n−m) rows of predetermined symbols. With reference to $D_0^T$ 502 and $B_1$ 512, the concatenation of the first (n−m) rows of $D_0^T$ and the first (n−m) rows in $B_1$ forms (n−m) shortened codewords. Similar comments apply in respect of column codewords that result from concatenating the first (n−m) columns of $D_1$ 508 and $B_2^T$.

The (n−m) supplemental rows or columns which are added to form the $D_i$ matrices in this example are added solely for the purposes of computing coding symbols. The added rows or columns need not be transmitted to a decoder with the data and coding symbols, since the same predetermined added symbols can also be added at the receiver during decoding.

Figure 6:
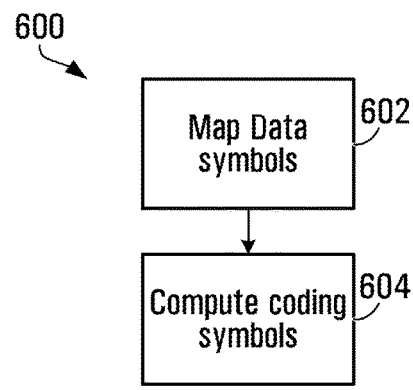
FIG. 6 is a flow diagram illustrating an example encoding method.

FIG. 6 is a flow diagram illustrating an example encoding method 600 that provides staircase encoding. The example method 600 involves an operation 602 of mapping a stream of data symbols to data symbol positions in a sequence of two-dimensional symbol blocks $B_i$, i a positive integer. Each of the symbol blocks includes data symbol positions and coding symbol positions. As shown at 604, the example method 600 also involves computing coding symbols. Coding symbols are computed for the coding symbol positions in each symbol block $B_i$ (i a positive integer) in the sequence such that, for each symbol $B_i$ that has a preceding symbol block $B_{i-1}$ and a subsequent symbol block $B_{i+1}$ in the sequence, symbols at symbol positions along one dimension of the preceding symbol block $B_{i-1}$, concatenated with the information symbols and the coding symbols along the other dimension in the symbol $B_i$, form a codeword of a FEC component code, and symbols at symbol positions along the one dimension of the symbol $B_i$, concatenated with the data symbols and the coding symbols along the other dimension in the subsequent symbol block $B_{i+1}$, form the same or a different codeword of the FEC component code.

The example method 600 is intended solely for illustrative purposes. Variations of the example method 600 are contemplated.

For example, all data symbols in a stream need not be mapped to symbol blocks at 602 before coding symbols are computed at 604. Coding symbols for a symbol block could be computed when the data symbol positions in that symbol block have been mapped to data symbols from the stream, or even as each row or column in a symbol block, depending on the computation being used, is mapped. Thus, the mapping at 602 and the computing at 604 need not strictly be serial processes in that the mapping need not be completed for an entire stream of data symbols before computing of coding symbols begins.

The mapping at 602 and/or the computing at 604 could involve operations that have not been explicitly shown in FIG. 6. One or more columns or rows could be added to symbol blocks or their matrix transposes for computation of coding symbols, where symbol blocks are non-square as described above.

Figure 7:
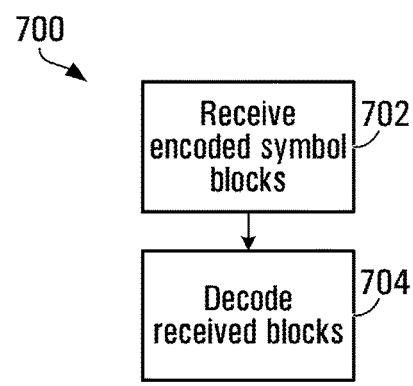
FIG. 7 is a flow diagram illustrating an example decoding method.

FIG. 7 is a flow diagram illustrating an example decoding method. The example decoding method 700 involves receiving, at 702, a sequence of FEC encoded two-dimensional symbol blocks $B_i$. Each of the received symbol blocks includes received versions of data symbols at data symbol positions and coding symbols at coding symbol positions. The coding symbols for the coding symbol positions in each symbol block $B_i$, i a positive integer, in the sequence would have been computed at a transmitter of the received symbol blocks, as described herein, such that, for each symbol block $B_i$, that has a preceding symbol block $B_{i-1}$, and a subsequent symbol block $B_{i+1}$ in the sequence, symbols at symbol positions along one dimension of the preceding symbol block $B_{i-1}$, concatenated with the data symbols and the coding symbols along the other dimension in the symbol block $B_i$, form a codeword of a FEC component code, and symbols at symbol positions along the one dimension of the symbol block $B_i$, concatenated with the data symbols and the coding symbols along the other dimension in the subsequent symbol block $B_{i+1}$, form a codeword of the FEC component code. At 704, the received FEC encoded symbol blocks are decoded. The decoding at 704 might involve syndrome-based iterative decoding, for example. During decoding, error locations in received data symbols are identified and corrected, provided the number of errors is within the error correcting capability of the FEC code, and iterative decoding proceeds on the basis of the corrected data symbols.

Figure 8:
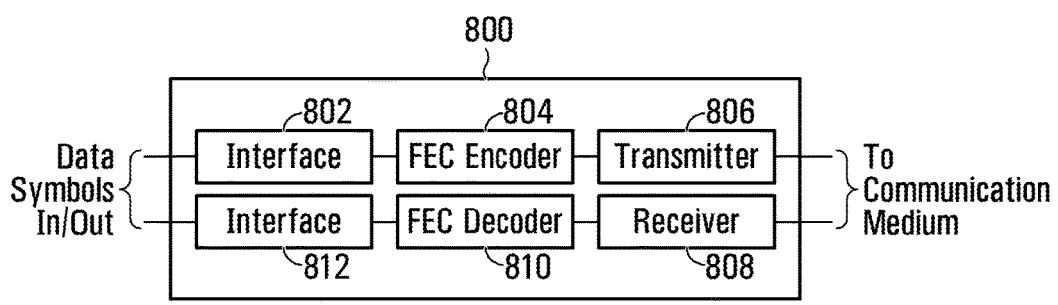
FIG. 8 is a block diagram illustrating an example apparatus.

Embodiments have been described above primarily in the context of code structures and methods. FIG. 8 is a block diagram illustrating an example apparatus. The example apparatus 800 includes an interface 802, a FEC encoder 804, a transmitter 806, a receiver 808, a FEC decoder 810, and an interface 812. A device or system in which or in conjunction with which the example apparatus 800 is implemented might include additional, fewer, or different components, operatively coupled together in a similar or different order, than explicitly shown in FIG. 8. For example, an apparatus need not support both FEC encoding and FEC decoding. Also, FEC encoded symbol blocks need not necessarily be transmitted or received over a communication medium by the same physical device or component that performs FEC encoding and/or decoding. Other variations are possible.

The interfaces 802, 812, the transmitter 806, and the receiver 808 represent components that enable the example apparatus 800 to transfer data symbols and FEC encoded data symbol blocks. The structure and operation of each of these components is dependent upon physical media and signalling mechanisms or protocols over which such transfers take place. In general, each component includes at least some sort of physical connection to a transfer medium, possibly in combination with other hardware and/or software-based elements, which will vary for different transfer media or mechanisms.

The interfaces 802, 812 enable the apparatus 800 to receive and send, respectively, streams of data symbols. These interfaces could be internal interfaces in a communication device or equipment, for example, that couple the FEC encoder 804 and the FEC decoder 810 to components that generate and process data symbols. Although labelled differently in FIG. 8 than the interfaces 802, 812, the transmitter 806 and the receiver 808 are illustrative examples of interfaces that enable transfer of FEC encoded symbol blocks. The transmitter 806 and the receiver 808 could support optical termination and conversion of signals between electrical and optical domains, to provide for transfer of FEC encoded symbol blocks over an optical communication medium, for instance.

The FEC encoder and the FEC decoder could be implemented in any of various ways, using hardware, firmware, one or more processors executing software stored in computer-readable storage, or some combination thereof. Application Specific Integrated Circuits (ASICs), Programmable Logic Devices (PLDs), Field Programmable Gate Arrays (FPGAs), and microprocessors for executing software stored on a non-transitory computer-readable medium such as a magnetic or optical disk or a solid state memory device, are examples of devices that might be suitable for implementing the FEC encoder 804 and/or the FEC decoder 810.

In operation, the example apparatus 800 provides for FEC encoding and decoding. As noted above, however, encoding and decoding could be implemented separately instead of in a single apparatus as shown in FIG. 8.

The FEC encoder 804 maps data symbols, from a stream of data symbols received by the interface 802 from a streaming source for instance, to data symbol positions in a sequence of two-dimensional symbol blocks $B_i$. As described above, each symbol block includes data symbol positions and coding symbol positions. The FEC encoder computes coding symbols for the coding symbol positions in each symbol block $B_i$, in the sequence such that, for each symbol block B that has a preceding symbol block $B_{i-1}$ and a subsequent symbol block $B_{i+1}$ in the sequence, symbols at symbol positions along one dimension of the preceding symbol block $B_{i-1}$, concatenated with the data symbols and the coding symbols along the other dimension in the symbol $B_i$, form a codeword of a FEC component code, and symbols at symbol positions along the one dimension of the symbol block B concatenated with the data symbols and the coding symbols along the other dimension in the subsequent symbol block $B_{i+1}$, form a codeword of the FEC component code. FEC encoded data symbols could then be transmitted over a communication medium by the transmitter 806.

FEC decoding is performed by the FEC decoder 810, on a sequence of FEC encoded two-dimensional symbol blocks $B_i$. These signal blocks are received through an interface, which in the example apparatus 800 would be the receiver

808. Each of the received symbol blocks includes received versions of data symbols at data symbol positions and coding symbols at coding symbol positions. The coding symbols for the coding symbol positions in each symbol block $B_i$ in the sequence would have been computed at a transmitter of the received symbol blocks. The transmitter might be a transmitter 806 at a remote communication device or equipment. The coding symbol computation at the transmitter is such that, for each symbol block $B_i$ that has a preceding symbol block $B_{i-1}$ and a subsequent symbol block $B_{i+1}$ in the sequence, symbols at symbol positions along one dimension of the preceding symbol block $B_{i-1}$, concatenated with the data symbols and the coding symbols along the other dimension in the symbol $B_i$, form a codeword of a FEC component code, and symbols at symbol positions along the one dimension of the symbol $B_i$, concatenated with the data symbols and the coding symbols along the other dimension in the subsequent symbol block $B_{i+1}$, form a codeword of the FEC component code. The FEC decoder 810 decodes the received FEC encoded symbol blocks.

Operation of the FEC encoder 804 and/or the FEC decoder 810 could be adjusted depending on expected or actual operating conditions. For example, where a particular application does not require maximum coding gain, a higher latency coding could be used to improve other coding parameters, such as burst error correction capability and/or error floor. In some embodiments, high coding gain and low latency are of primary importance, whereas in other embodiments different coding parameters could take precedence.

Figure 9:
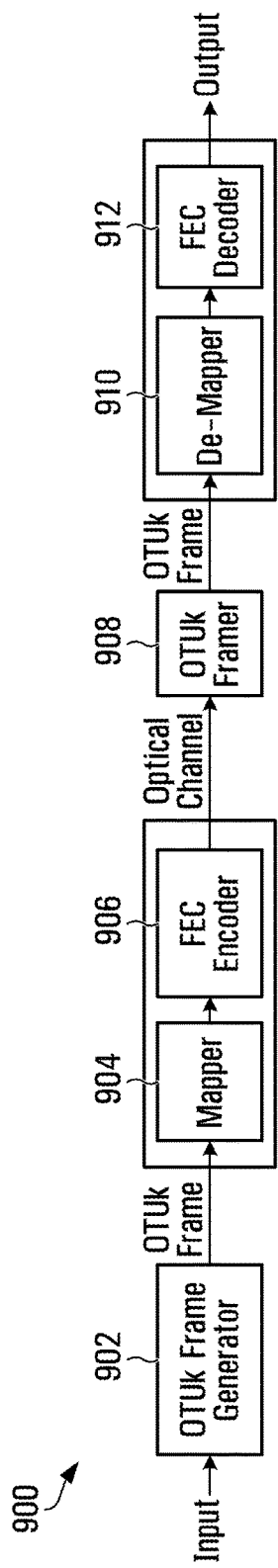
FIG. 9 is a block diagram illustrating another example apparatus.

Other functions might also be supported at encoding and/or decoding apparatus. FIG. 9 is a block diagram illustrating an example optical communication system 900 that includes FEC encoding and FEC decoding. The example optical communication system 900 includes an OTUk frame generator 902, a mapper 904, and a FEC encoder 906 at an encoding/transmit side of an optical channel, and an OTUk framer 908, a FEC de-mapper 910, and a FEC decoder 912 at a receive/decoding side of the optical channel. In the example device 800, the FEC encoder 804 and the FEC decoder 810 implement mapping/coding and demapping/decoding, respectively. The example communication system 900 includes separate mapping, coding, demapping, and decoding elements in the form of the mapper 904, the FEC encoder 906, the FEC de-mapper 910, and the FEC decoder 912.

In operation, the OTUk frame generator 902 generates frames that include data and parity information positions. Data symbols in the OTUk frame data positions are mapped to data positions in the blocks B as described above. Coding symbols are then computed by the FEC encoder 906 and used to populate the parity information positions in the OTUk frames generated by the OTUk frame generator 902 in the example shown. At the receive side, the OTUk framer 908 receives signals over the optical channel and delineates OTUk frames, from which data and parity symbols are demapped by the demapper 910 and used by the FEC decoder 912 in decoding.

Examples of staircase FEC codes, encoding, and decoding have been described generally above. More detailed examples are provided below. It should be appreciated that the following detailed examples are intended solely for non-limiting and illustrative purposes.

As a first example of a G.709-compatible FEC staircase code, consider a 512×510 staircase code, in which each bit is involved in two triple-error-correcting (1022, 990) component codewords. The parity-check matrix H of this example component code is specified in Appendix B.2, The assignment of bits to component codewords is described by first considering successive two-dimensional blocks $B_i$, $i \geq 0$ of binary data, each with 512 rows and 510 columns. The binary value stored in position (row,column)=(j,k) of $B_i$ is denoted $d_i\{j,k\}$.

In each such block, information bits are stored as $d_i\{j,k\}$, $0 \leq j \leq 511$, $0 \leq k \leq 477$, and parity bits are stored as $\{j,k\}$, $0 \leq j \leq 511$, $478 \leq k \leq 509$. The parity bits are computed as follows:

For row j, $0 \leq j \leq 1$, select $d_i\{j,478\}$, $d_i\{j,479\}$, ..., $d_i\{j,509\}$, such that $v=[0, 0, \ldots 0, d_i\{j,0\}, d_i\{j,1\}, \ldots d_i\{j,509\}]$ satisfies $Hv^T=0$ For row j, $2 \leq j \leq 511$, select $d_i\{j,478\}$, $d_i\{j,479\}$, ..., $d_i\{j,509\}$, such that $v=[d_{i-1}\{0,l\}, d_{i-1}\{1,l\}, \ldots d_{i-1}\{511,l\}, d_i\{j,0\}, d_i\{j,1\}, \ldots, d_i\{j,509\}]$ satisfies $Hv^T=0$ where $l=\Pi(j-2)$ and n is a permutation function specified in Appendix B.1.

The information bits in block $B_i$ in this example map to two G.709 OTUk frames, i.e., frames 2i and 2i+1. The parity bits for frames 2i and 2i+1 are the parity bits from block $B_{i-1}$. The parity bits of the two OTUk frames into which the information symbols in symbol block $B_1$ are mapped can be assigned arbitrary values.

Figure 10:
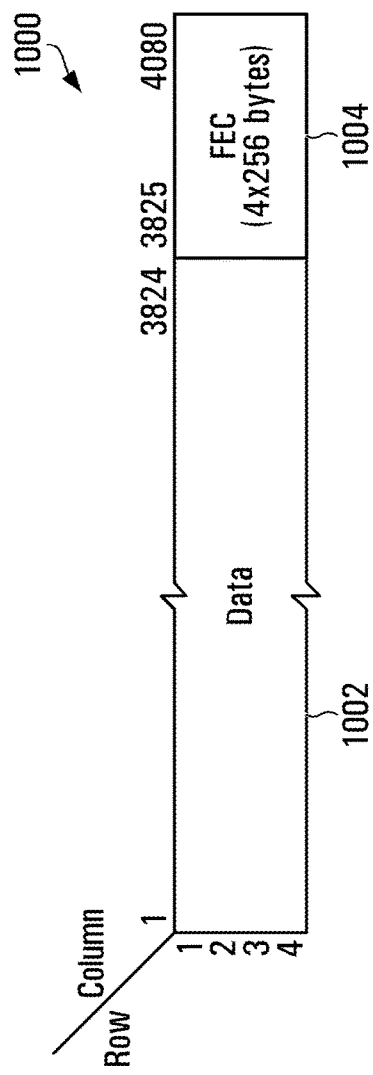
FIG. 10 is a block diagram illustrating an example frame structure.

As shown in FIG. 10, which is a block diagram illustrating an example frame structure 1000 that reflects the OTN OTUk frame structure, an OTUk frame 1000 includes 4 rows of byte-wide columns. Each row includes 3824 bytes of data 1002 to be encoded, and 256 FEC bytes 1004. Thus, each row consists of 30592 information bits and 2048 parity bits. The mapping of information and parity bits for each row, and their specific order of transmission, are specified as follows:

$d_i\{m \bmod 512 \cdot \lfloor m/512 \rfloor\}, 30592l \leq m \leq 30592l+30591$      Information $d_{i-1}\{m \bmod 512, 478+\lfloor m/512 \rfloor\}, 2048l \leq m \leq 2048l+2047$      Parity The precise assignment of bits to frames, as a function of l, is as follows:
Frame 2i, row 1: l=0
Frame 2i, row 1: l=1
Frame 2i, row 1: l=2
Frame 2i, row 1: l=3
Frame 2i+1, row 1: l=4
Frame 2i+1, row 1: l=5
Frame 2i+1, row 1: l=6
Frame 2i+1, row 1: l=7.

In another example, each bit in a 196×187 staircase code is involved in two triple-error-correcting (383, 353) component codewords. The parity-check matrix H of the component code is specified in Appendix C.2. The assignment of bits to component codewords is again described by first considering successive two-dimensional blocks $B_i, i \geq 0$, of binary data, each with 196 rows and 187 columns. The binary value stored in position (row,column)=(j,k) of $B_i$ is denoted $d_i\{j,k\}$.

In each such block, information bits are stored as $d_i\{j,k\}$, $0 \leq j \leq 195$, $0 \leq k \leq 156$, and parity bits are stored as $\{j,k\}$, $0 \leq j \leq 195$, $157 \leq k \leq 186$. The parity bits are computed as follows:

For row j, $0 \leq j \leq 8$, select $d_i\{j,157\}, d_i\{j,158\}, \ldots, d_i\{j,186\}$, such that $v=[0, 0, \ldots, 0, d_i\{j,0\}, d_i\{j,1\}, \ldots, d_i\{j,186\}]$
satisfies $$Hv^T=0.$$

For row j, $9 \leq j \leq 195$, select $d_i\{j,157\}, d_i\{j,158\}, \ldots, d_i\{j,186\}$, such that $v=[d_{i-1}\{0,1\}, d_{i-1}\{1,1\}, \ldots, d_{i-1}\{195,1\}, d_i\{j,0\}, d_i\{j,1\}, \ldots, d_i\{j,186\}]$
satisfies $$Hv^T=0.$$

where $l=\Pi(j-9)$, and $\Pi$ is a permutation function specified in Appendix C.1.

The information bits in block $B_i$ to one OTUk row. The parity bits for row i are the parity bits from block $B_{i-1}$; although there are four rows per OTUk frame, all rows could be numbered consecutively, ignoring frame boundaries. The information and parity bits to be mapped to row i, and their specific order of transmission, are specified as follows:

$d_i\{m \bmod 196 \cdot \lfloor m/196 \rfloor\}, 180 \leq m \leq 30771$  Information $d_{i-1}\{m \bmod 196, 157+\lfloor m/196 \rfloor\}, 0 \leq m \leq 5879.$  Parity In this example, eight dummy bits are appended to the end of the parity stream to complete an OTUk row. Furthermore, the first 180 bits in the first column of each staircase block are fixed to zero, and thus need not be transmitted.

Syndrome-based iterative decoding can be used to decode a received signal. Generation of the syndromes is done in a similar fashion to the encoding. The resulting syndrome equation could be solved using a standard FEC decoding scheme and error locations are determined. Bit values at error locations are then flipped, and standard iterative decoding proceeds.

The latency of decoding is a function of number of blocks used in the decoding process. Generally, increasing the number of blocks improves the coding gain. Decoding could be configured in various latency modes to trade-off between latency and coding gain.

What has been described is merely illustrative of the application of principles of embodiments of the invention. Other arrangements and methods can be implemented by those skilled in the art without departing from the scope of the present invention.

For example, the divisions of functions shown in FIGS. 8 and 9 are intended solely for illustrative purposes.

As noted above, the roles of columns and rows in a staircase code could be interchanged. Other mappings between bits or symbols in successive blocks might also be possible. For instance, coding symbols in a block that is currently being encoded could be determined on the basis of symbols at symbol positions along a diagonal direction in a preceding block and the current block. In this case, a certain number of symbols could be selected along the diagonal direction in each block, starting at a certain symbol position (e.g., one corner of each block) and progressing through symbol positions along different diagonals if necessary, until the number of symbols for each coding computation has been selected. As coding symbols are computed, the process would ultimately progress through each symbol position along each diagonal. Other mappings might be or become apparent to those skilled in the art.

In addition, although described primarily in the context of code structures, methods and systems, other implementations are also contemplated, as instructions stored on a non-transitory computer-readable medium, for example.

APPENDIX A: REPRESENTATION OF ELEMENTS IN $GF(2^{io})$

For a root $\alpha$ of the primitive polynomial $p(x)=1+x^3+x^{10}$, the non-zero field elements of $GF(2^{10})$ can be represented as $$\alpha^i, 0 \leq i \leq 1022,$$

which we refer to as the "power" representation. Equivalently, we can write $$\alpha^i = b_9\alpha^9 + b_8\alpha^8 + \ldots + b_0, 0 \leq i \leq 1022;$$

we refer to the integer $l=b_9 2^9 + b_8 2^8 + \ldots + b_0$ as the "binary" representation of the field element. We further define the function $\log(\cdot)$ and its inverse $\exp(\cdot)$ such that for l, the binary representation of $\alpha^i$, we have $$\log(l)=i$$

and $$\exp(i)=l.$$

APPENDIX B: G.709 COMPATIBLE HIGH-GAIN FEC MAPPING

B.1—Specification of $\Pi$ $\Pi$ is a permutation function on the integers i, $0 \leq i \leq 509$. In the following, $\Pi(M:M+N)=K:K+N$ is shorthand for $\Pi(M)=K, \Pi(M+1)=K+1, \ldots, \Pi(M+N)=K+N$. The definition of $\Pi$ is as follows:

$\Pi(0:7)=478:485$ $\Pi(8)=0$ $\Pi(9:11)=486:488$ $\Pi(12)=1$
$\Pi(13)=489$ $\Pi(14:16)=2:4$ $\Pi(17:19)=490:492$ $\Pi(20)=5$
$\Pi(21)=493$ $\Pi(22:24)=6:8$ $\Pi(25)=494$ $\Pi(26:32)=9:15$
$\Pi(33:35)=495:497$ $\Pi(36)=16$ $\Pi(37)=498$ $\Pi(38:40)=17:19$
$\Pi(41)=499$ $\Pi(42:48)=20:26$ $\Pi(49)=500$ $\Pi(50:64)=27:41$
$\Pi(65:67)=501:503$ $\Pi(68)=42$ $\Pi(69)=504$ $\Pi(70:72)=43:45$
$\Pi(73)=505$ $\Pi(74:80)=46:52$ $\Pi(81)=506$ $\Pi(82:128)=53:99$
$\Pi(129)=507$ $\Pi(130)=100$ $\Pi(131)=508$ $\Pi(132:256)=101:225$
$\Pi(257)=509$ $\Pi(258:509)=226:477$

B.2—Parity-Check Matrix

Consider the function $f$ which maps an integer i, $1 \leq i \leq 1023$, to the column vector $$f(i) = \begin{bmatrix} \beta_i \\ \beta_i^2 \\ \beta_i^3 \\ F(\beta_i) \\ \overline{F(\beta_i)} \end{bmatrix},$$

where $$\beta_i = \alpha^{\log(i)}, \text{ and}$$

$$F(\beta_i) = b_2 \sqrt{b_1^l b_0^l} \sqrt{b_2^l} b_1^l \sqrt{b_2^l b_1^l} b_0^l,$$

for l the binary representation of $\beta_i$, and $\overline{x}$ is the complement of x. Then, $H=[f(1021) \; f(1022) \; f(1) \; \ldots \; f(510) \; f(511+\Pi^{-1}(0)) \; \ldots \; f(511+\Pi^{-1}(509))]$.

APPENDIX C: 20% HIGH-GAIN FEC MAPPING

C.1—Specification of Π

Π is a permutation function on the integers i, $0 \leq i \leq 186$. In the following, $\Pi(M:M+N)=K:K+N$ is shorthand for $\Pi(M)=K, \Pi(M+1)=K+1, \ldots, \Pi(M+N)=K+N$. The definition of Π is as follows:

$\Pi(0:7)=157:164$ $\Pi(8)=0$ $\Pi(9:11)=165:167$ $\Pi(12)=1$
$\Pi(13)=168$ $\Pi(14:16)=2:4$ $\Pi(17:19)=169:171$ $\Pi(20)=5$
$\Pi(21)=172$ $\Pi(22:24)=6:8$ $\Pi(25)=173$ $\Pi(25:32)=9:15$
$\Pi(33:35)=174:176$ $\Pi(36)=16$ $\Pi(37)=177$ $\Pi(33:40)=17:19$
$\Pi(41)=178$ $\Pi(42:48)=20:26$ $\Pi(49)=179$ $\Pi(53:64)=27:41$
$\Pi(65:67)=180:182$ $\Pi(68)=42$ $\Pi(69)=183$ $\Pi(73:72)=43:45$
$\Pi(73)=184$ $\Pi(74:128)=46:100$ $\Pi(129)=185$ $\Pi(130)=101$
$\Pi(131)=186$ $\Pi(131:186)=102:156$

C.2—Parity-Check Matrix

Consider the function $f$ which maps an integer i, $315 \leq i \leq 697$, to the column vector $$f(i) = \begin{bmatrix} \beta_i \\ \beta_i^2 \\ \beta_i^3 \end{bmatrix},$$

where $\beta_i = \alpha^{log(i)}$.

for l the binary representation of $\beta_i$. Then, $H=[f(315)f(316)f(317) \ldots f(697)]$.

We claim:

1. An apparatus comprising:
a mapper to receive a stream of data symbols from a transport network and to map the stream of data symbols among data symbol positions in a sequence of two-dimensional symbol blocks $B_i$, i a positive integer, each of the symbol blocks comprising data symbol positions and coding symbol positions; and
a Forward Error Correction (FEC) encoder device comprising an Application Specific Integrated Circuit (ASIC), operatively coupled to the mapper, to process coding symbols for the coding symbol positions in each symbol block in the sequence, the coding symbols being processed such that, for each symbol block $B_i$ that has a preceding symbol block $B_{i-1}$ and a subsequent symbol block $B_{i+1}$ in the sequence, symbols at symbol positions along one dimension of the preceding symbol block $B_{i-1}$, concatenated with symbols at symbol positions along the other dimension in the symbol block $B_i$, form a codeword of a FEC component code, and symbols at symbol positions along the one dimension of the symbol block $B_i$, concatenated with symbols at symbol positions along the other dimension in the subsequent symbol block $B_{i+1}$, form a codeword of the FEC component code,
wherein each symbol block comprises an n row by m column array of symbols, m, $n \geq 1$, $n > m$, the FEC encoder device processing the coding symbols for the coding symbol positions in each symbol block $B_i$ based on $D_{i-1}$ and $B_i$, where $D_{i-1}$ is a matrix formed by the ASIC adding (n−m) sets of n predetermined symbols along the one dimension of $B_{i-1}$.

2. The apparatus of claim 1, wherein the mapper maps the stream of data symbols to the symbol positions from one or more Optical channel Transport Unit (OTUk) frames.

3. The apparatus of claim 1, wherein the predetermined symbols comprise all zeros.

4. The apparatus of claim 1, wherein the symbol blocks comprise 512 rows by 510 columns of bits, and wherein the FEC component code comprises a Bose-Chaudhuri-Hocquenghem (1022, 990) code.

5. The apparatus of claim 4, wherein the mapping comprises mapping information bits of two Optical channel Transport Unit (OTUk) frames to information symbols in each symbol block $B_i$, $i \geq 1$, the method further comprising:
mapping the coding symbols in each symbol block $B_{i-1}$, $i \geq 2$, to parity bits of the two OTUk frames to which the information symbols in symbol block $B_i$ are mapped.

6. The apparatus of claim 1, wherein the symbol blocks comprise 196 rows by 187 columns of bits, and wherein the FEC component code comprises a Bose-Chaudhuri-Hocquenghem (383, 353) code.

7. The apparatus of claim 6, wherein the mapping comprises mapping information bits of one of four rows of an Optical channel Transport Unit (OTUk) frame to information symbols in each symbol block $B_i$, $i \geq 1$, and
mapping the coding symbols in each symbol block $B_{i-1}$, $i \geq 2$, to parity bits of the Optical channel Transport Unit (OTUk) frame to which the information symbols in symbol block $B_i$ are mapped.

8. An apparatus that comprises:
an interface to receive a sequence of FEC encoded two-dimensional symbol blocks $B_i$, i a positive integer, each of the received symbol blocks comprising received versions of data symbols at data symbol positions and coding symbols at coding symbol positions, the coding symbols for the coding symbol positions in each symbol block $B_i$ in the sequence having been processed at a transmitter of the received symbol blocks such that, for each symbol block $B_i$ that has a preceding symbol block $B_{i-1}$ and a subsequent symbol block $B_{i+1}$ in the sequence, symbols at symbol positions along one dimension of the preceding symbol block $B_{i-1}$, concatenated with symbols at symbol positions along the other dimension in the symbol block $B_i$, form a codeword of a FEC component code, and symbols at symbol positions along the one dimension of the symbol block $B_i$, concatenated with symbols at symbol positions along the other dimension in the subsequent symbol block $B_{i+1}$, form a codeword of the FEC component code; and
an FEC decoder device comprising an Application Specific Integrated Circuit (ASIC), operatively coupled to the interface, to decode the received FEC encoded symbol blocks,
wherein each symbol block comprises an n row by m column array of symbols, m, $n > 1$, $n > m$, the FEC encoder device processing the coding symbols for the coding symbol positions in each symbol block $B_i$ based on $D_{i-1}$ and $B_i$, where $D_{i-1}$ is a matrix formed by the ASIC adding (n−m) sets of n predetermined symbols along the one dimension of $B_{i-1}$.

* * * * *